United States Patent [19]

Kagami

[11] Patent Number: 5,347,491
[45] Date of Patent: Sep. 13, 1994

[54] DYNAMIC RANDOM ACCESS MEMORY DEVICE HAVING AUTOREFRESHING UNIT FOR PRODUCING INTERNAL ROW ADDRESS STROBE SIGNAL AND INTERNAL COLUMN ADDRESS STROBE SIGNAL

[75] Inventor: Akihiko Kagami, Tokyo, Japan
[73] Assignee: NEC Corporation, Tokyo, Japan
[21] Appl. No.: 865,863
[22] Filed: Apr. 9, 1992
[30] Foreign Application Priority Data
Apr. 11, 1991 [JP] Japan .................. 3-0108642
[51] Int. Cl.⁵ .............................. G11C 7/00
[52] U.S. Cl. .................. 365/222; 365/193; 365/233
[58] Field of Search .......... 365/222, 193, 233
[56] References Cited

U.S. PATENT DOCUMENTS 4,831,597  5/1989  Fuse .................. 365/193 X
4,939,695  7/1990  Isobe et al. .............. 365/222
4,985,868  1/1991  Nakano et al. ............ 365/222

FOREIGN PATENT DOCUMENTS 0174638  3/1986  European Pat. Off. ........ 365/222
0212547  3/1987  European Pat. Off. ........ 365/222

Primary Examiner—Eugene R. LaRoche
Assistant Examiner—Son Dinh
Attorney, Agent, or Firm—Sughrue, Mion, Zinn, Macpeak & Seas

[57] ABSTRACT

A dynamic random access memory device periodically refreshes data bits stored in the memory cells for preventing the data bits from destruction, and an autorefreshing unit incorporated in the dynamic random access memory device is responsive to a CAS-Before-RAS signal control for producing an internal row address strobe signal so that the data bits are automatically refreshed with the internal row address strobe signal in a sequence of self-refreshing cycles without any external signal control.

4 Claims, 10 Drawing Sheets

DYNAMIC RANDOM ACCESS MEMORY DEVICE HAVING AUTOREFRESHING UNIT FOR PRODUCING INTERNAL ROW ADDRESS STROBE SIGNAL AND INTERNAL COLUMN ADDRESS STROBE SIGNAL

FIELD OF THE INVENTION

This invention relates to a dynamic random access memory device and, more particularly, to a refreshing unit incorporated in the dynamic random access memory device.

DESCRIPTION OF THE RELATED ART

Data bits are stored in respective memory cells of the dynamic random access memory device in the form of electric charges, and the electric charges tend to leak from the memory cells. For this reason, it is necessary for the dynamic random access memory device to refresh the data bits at predetermined intervals, and various refreshing technologies have been proposed for the dynamic random access memory device. One of such a refreshing technologies is known as "Cas-Before-Ras autorefreshing mode", and "Cas-Before-RAS" is abbreviated as "CBR". If a standard mode of operation, a row address strobe signal RAS firstly goes down, and a column address strobe signal CAS follows the row address strobe signal RAS. However, if the column address strobe signal CAS goes down before the row address signal, the dynamic random access memory device enters the CBR autorefreshing mode. In the CBR autorefreshing mode, an internal row address counter incorporated in the dynamic random access memory device increments row address indicative of a row address of the memory cell array in synchronism with the row address strobe signal RAS, and data bits stored in the rows are sequentially refreshed.

However, a problem is encountered in the prior art dynamic random access memory device in that an external device repeatedly swings the row address strobe signal RAS for incrementing the row address. If the dynamic random access memory device is of the 1 mega-bit type, the external device swings the row address strobe signal 512 times. In case of a 4 mega-bit dynamic random access memory device, the row address strobe signal RAS alternates 1024 times. Such frequent alternation requires a complex program sequence executed by the external device.

SUMMARY OF THE INVENTION

It is therefore an important object of the present invention to provide a dynamic random access memory device which refreshes data bits stored in the memory cell array without alternation of a row address strobe signal.

To accomplish the object, the present invention proposes to internally produce a row address strobe signal without any external signal control.

In accordance with the present invention, there is provided a dynamic random access memory device having a standard mode and an autorefreshing mode of operation, comprising: a) a plurality of memory cells arranged in rows and columns; b) peripheral circuits operative to assist a read-out cycle and a write-in cycle in the standard mode and to be responsive to an internal row address strobe signal for carrying out a self-refreshing cycle in the autorefreshing mode of operation; and c) an autorefreshing unit responsive to an external column address signal as well as an external row address signal sequentially shifted to an active level in a predetermined order, and operative to periodically produce the internal row address strobe signal for causing the peripheral circuits to repeat the self-refreshing cycle.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
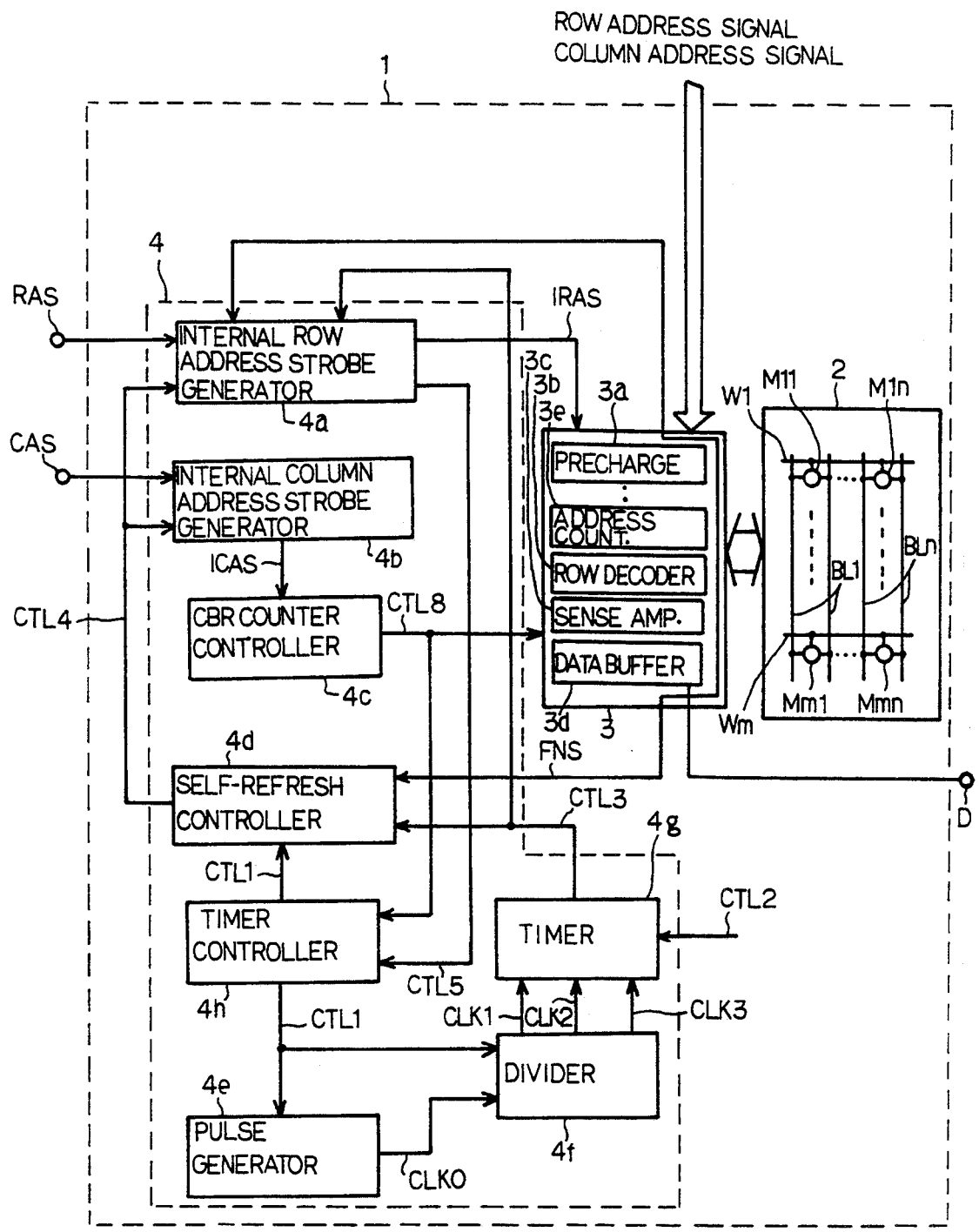
FIG. 1 is a block diagram showing the circuit arrangement of a dynamic random access memory device according to the present invention.

Referring first to FIG. 1 of the drawings, a dynamic random access memory device embodying the present invention is fabricated on a single semiconductor chip 1, and largely comprises a memory cell array 2 for storing data bits in the form of electric charges, a peripheral circuit group 3 associated with the memory cell array 1 for a standard mode, i.e., a read-out mode and a write-in mode of operation, and an autorefreshing unit 4 for an autorefreshing mode of operation. Parts of the peripheral circuit group are involved in the autorefreshing mode of operation. The memory cell array 1 is constituted by a plurality of memory cells M11, M1n, Mm1 and Mmn arranged in rows and columns, and each of the memory cells M11 to Mmn is implemented by a series combination of a transfer transistor and a storage capacitor. A data bit is stored in the storage capacitor in the form of electric charges, and is transferred between one of bit line pairs BL1 to BLn and one of the memory cells M11 to Mmn. A plurality of word lines W1 to Wm are respectively coupled with the rows of the memory cell array 2, and one of the word lines W1 to Wm causes the associated row of the memory cell array 2 to couple with the bit line pairs BL1 to BLn.

The peripheral circuit group 2 includes a precharging circuit 3a, a row address decoder 3b, word line drivers, sense amplifier circuits 3c, a column address decoder, a column selector, an input-and-output data buffer 3d associated with a data pin D, a timing controller, and an internal address counter 3e. In the standard mode of operation, a data bit is written into or read out from one of the memory cells M11 to Mmn, and the peripheral circuit group 3 assists the read-out operation and the write-in operation as well know in the art.

In the autorefreshing mode, the precharging circuit 3a is responsive to an internal row address strobe signal IRAS for precharging bit line pairs (not shown) associated with the memory cell array 2, and the internal row address strobe signal IRAS allows the peripheral circuit group 3 to start a self-refreshing cycle on a row of the memory cell array 2. Namely, the internal address counter 3e supplies a row address to the row address decoder 3b, and one of the word line drivers drives the associated word line. Data bits are read out from the row of memory cells to the bit line pairs, and the sense amplifier circuits 3c develop small differential voltage levels respectively indicative of the data bits. The differential voltage levels thus developed are restored in the row of the memory cells, and the sense amplifier circuits 3c produces a finish signal FNS. However, the peripheral circuits are known to a person skilled in the art, and no further description is incorporated hereinbefore for the sake of simplicity.

The autorefreshing unit 4 comprises an internal row address strobe generator 4a, an internal column address strobe generator 4b, a CBR counter controller 4c, a self-refresh controller 4d, a pulse generator 4e, a divider 4f, a timer 4g, and a timer controller 4h.

Figure 2:
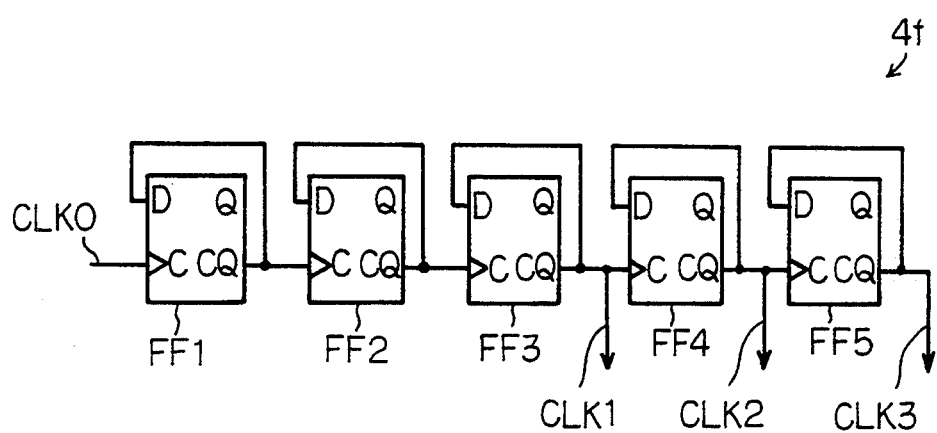
FIG. 2 is a block diagram showing the arrangement of a divider incorporated in the dynamic random access memory device shown in FIG. 2.

The pulse generator 4e is activated with a first control signal CTL1, and produces a basic clock signal CLK0. The basic clock signal CLK0 is supplied to the divider 4f, and the divider 4f produces first to third clock signals CLK1, CLK2 and CLK3. The divider 4f is implemented by a series combination of flip flop circuits FF1, FF2, FF3, FF4 and FF5 as shown in FIG. 2, and the basic clock signal CLK0 is supplied to an input node C of the flip flop circuit FF1. The output nodes CQ of the flip flop circuits FF1 to FF5 are respectively coupled with input nodes D thereof, and the first to third clock signals CLK1 to CLK3 are supplied from the output nodes CQ of the flip flop circuits FF3 to FF5, respectively. Each cycle of the first clock signal CLK1 is adjusted to 31 micro-second, and the second and third clock signals CLK2 and CLK3 respectively alternate during 62 micro-seconds and 124 micro-seconds, respectively.

Figure 3:
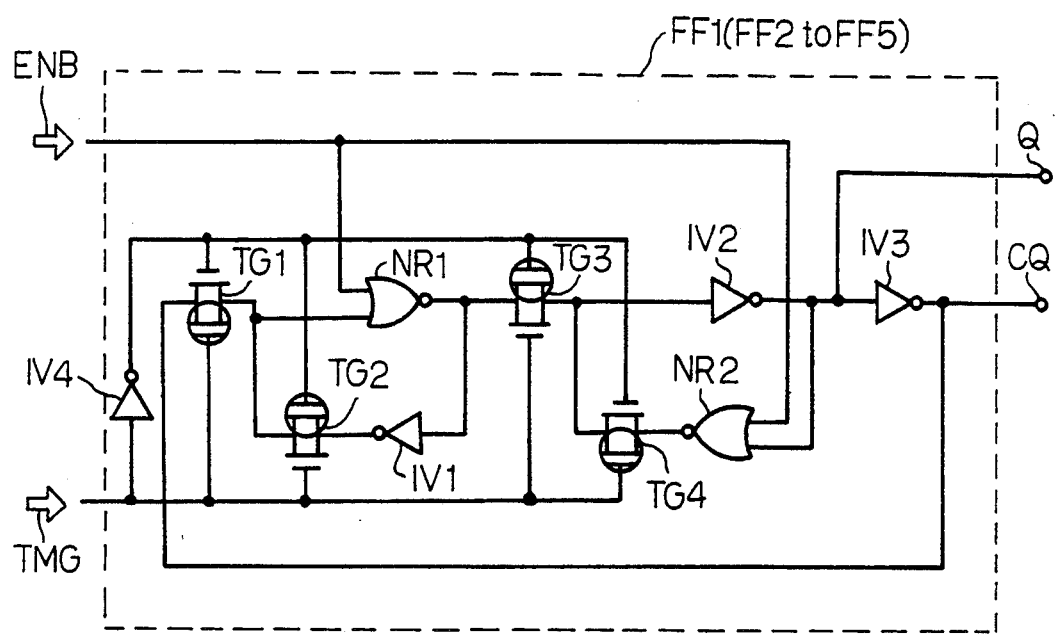
FIG. 3 is a circuit diagram showing the circuit arrangement of a flip flop circuit forming a part of the divider.

The circuit arrangement of each of the flip flop circuits FF1 to FF5 is illustrated in FIG. 3, and comprises transfer gates TG1, TG2, TG3 and TG4, two NOR gates NR1 and NR2 and four inverting circuits IV1, IV2, IV3 and IV4. The transfer gates TG1 to TG4 are gated by a timing clock TMG, however, the transfer gates TG1 and TG4 are complementarily shifted with respect to the transfer gates TG2 and TG3. The NOR gate NR1 and the inverting circuit IV1 form a first feedback loop for storing a data bit, and the NOR gate NR2 and the inverting circuit IV2 also form another or second feedback loop for the data bit. The inverting circuits IV2 and IV3 are respectively coupled with the output nodes Q and CQ, and the NOR gates NR1 and NR2 are enabled with an enable signal ENB of logic "0" level. The flip flop circuit thus arranged latches a data bit at the output node CQ through the transfer gate TG1, and sequentially transfers the data bit from the first feedback loop through the transfer gate TG3, the second feedback loop and the inverting circuit IV3 to the output node CQ.

The first to third clock signals CLK1 to CLK3 are supplied to the timer 4g, and the timer 4g is responsive to a second control signal CTL2 for selecting either clock signal CLK1 or CLK3. Namely, if the second control signal CTL2 is in logic "1" level corresponding to a high voltage level, the timer 4g becomes responsive to the first clock signal CLK1, and produces a third control signal CTL3. However, if, on the other hand, the second control signal CTL2 is in logic "0" level, the timer 4g produces the third control signal CTL3 on the basis of the third clock signal CLK3. As will be described hereinlater, the third control signal CTL3 deeply concerns intervals of self-refreshing cycles, and the intervals are prolonged or shrunk depending upon the second control signal CTL2. This feature is desirable in view of enhancement of production yield, because products with leaky memory cells are rescued by selecting the third clock signal CLK3.

Figure 4:
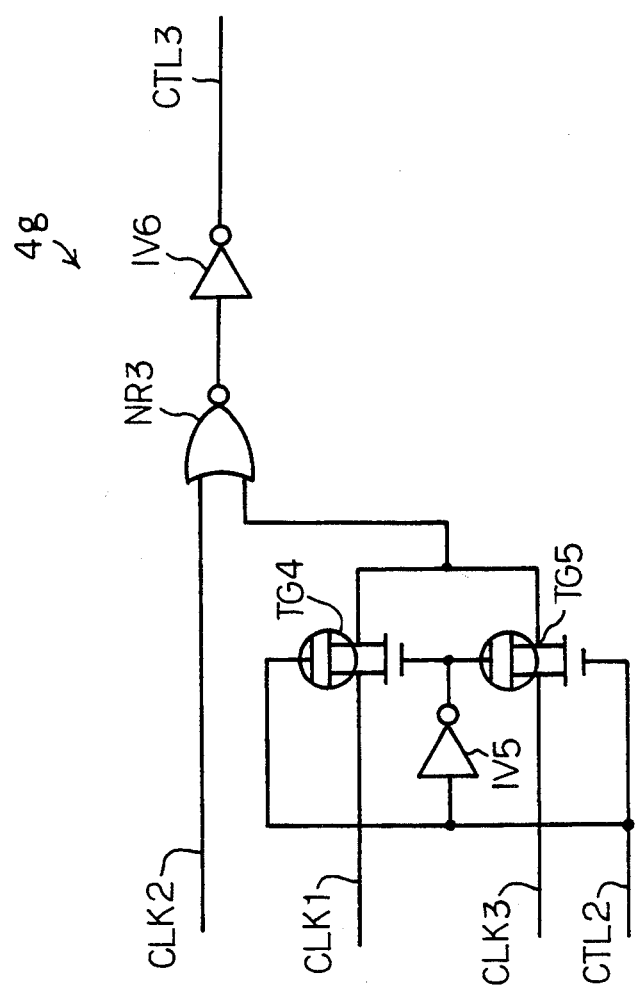
FIG. 4 is a circuit diagram showing the circuit arrangement of a timer incorporated in the dynamic random access memory device shown in FIG. 1.

The circuit arrangement of the timer 4g is illustrated in FIG. 4 of the drawings, and comprises two transfer gates TG4 and TG5 associated with an inverting circuit IV5, a NOR gate NR3 enabled with the second clock signal CLK2, and an inverting circuit IV6 for producing the third control signal CTL3. The transfer gates TG4 and TG5 are responsive to the second control signal CTL2 and the complementary signal thereof, and are complementarily shifted between on and off states. Therefore, one of the transfer gates TG4 and TG5 turns on depending upon the second control signal CTL2, and either first or third clock signal CLK1 or CLK3 is supplied to the NOR gate NR3. The second clock signal CLK2 is NORed with either first or third clock signal CLK1 or CLK3, and the third control signal CTL3 periodically alternates for controlling the self-refreshing cycle.

Figure 5:
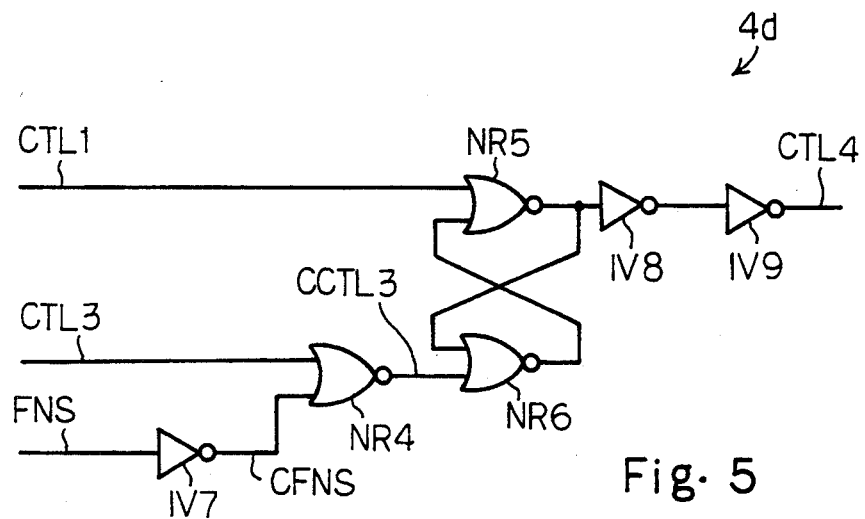
FIG. 5 is a circuit diagram showing the circuit arrangement of a self-refresh controller incorporated in the dynamic random access memory device shown in FIG. 1.

The third control signal CTL3 is distributed to the internal row address strobe generator 4a as well as to the self-refresh controller 4d. The self-refresh counter 4d is illustrated in detail in FIG. 5 of the drawings, and comprises three NOR gates NR4, NR5 and NR6 and three inverting circuits IV7, IV8 and IV9. The finish signal FNS is supplied to the inverting circuit IV7, and the inverting circuit IV7 supplies the complementary finish signal CFNS to the NOR gate NR4. The NOR gate NR4 is enabled with the complementary finish signal CFNS, and produces the complementary signal CCTL3 of the third control signal CTL3. As will be understood hereinlater, the timer controller 4h produces the first control signal CTL1 of logic "0" level corresponding to a low voltage level when an external row address strobe signal RAS goes down in the presence of an column address strobe signal CAS of logic "0" level. For this reason, the NOR gate NR5 is enabled with the first control signal CTL1 upon entering into the CAS-Before-RAS autorefreshing mode, and the flip flop circuit implemented by the NOR gates NR5 and NR6 latches logic "1" level upon decay of the third control signal CTL3. The self-refresh controller 4d continues to produce a fourth control signal CTL4 until the external row address strobe signal RAS is recovered to logic "1" level.

Figure 6:
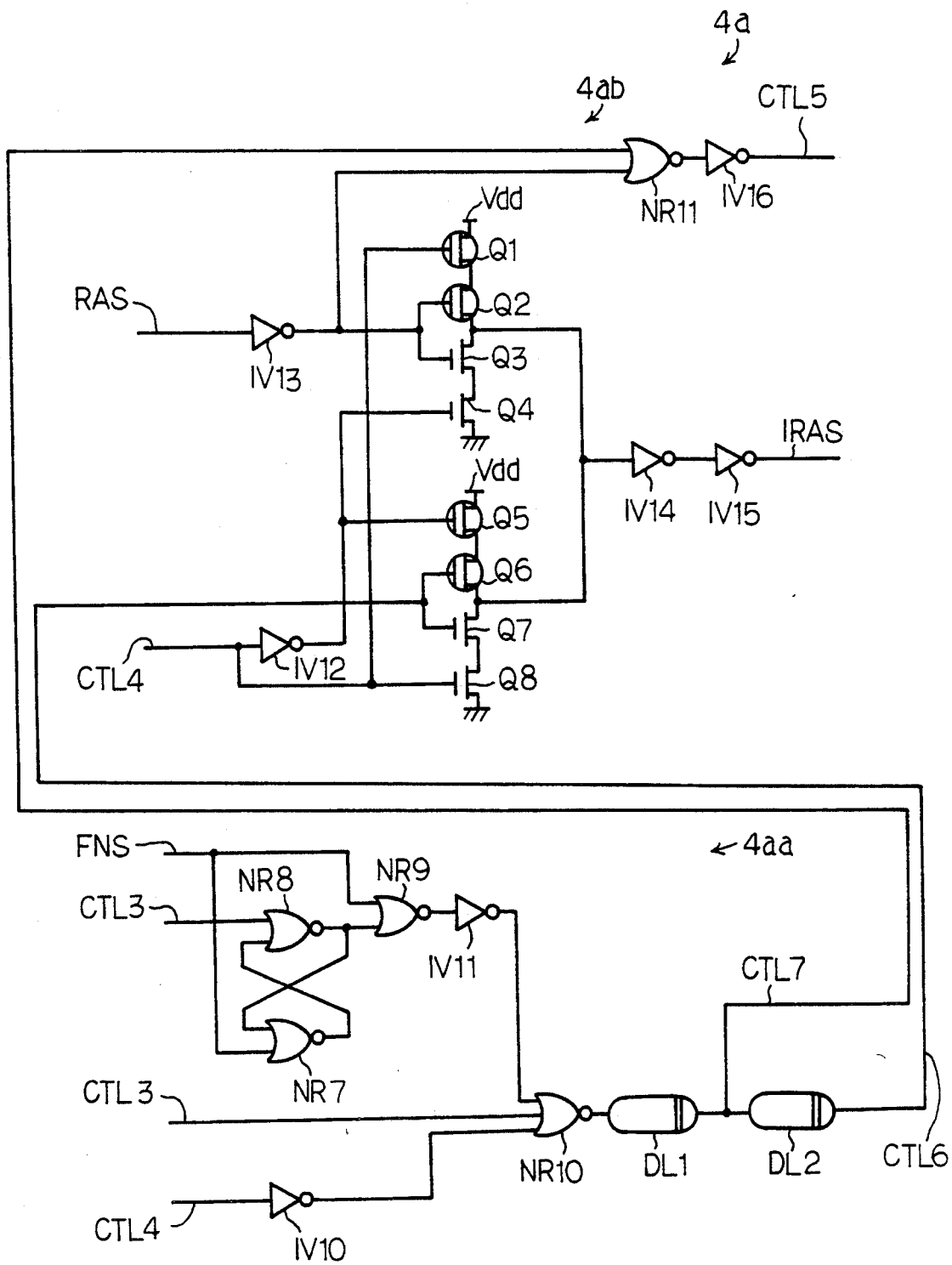
FIG. 6 is a circuit diagram showing the circuit arrangement of an internal row address strobe generator incorporated in the dynamic random access memory device shown in FIG. 1.
Figure 9:
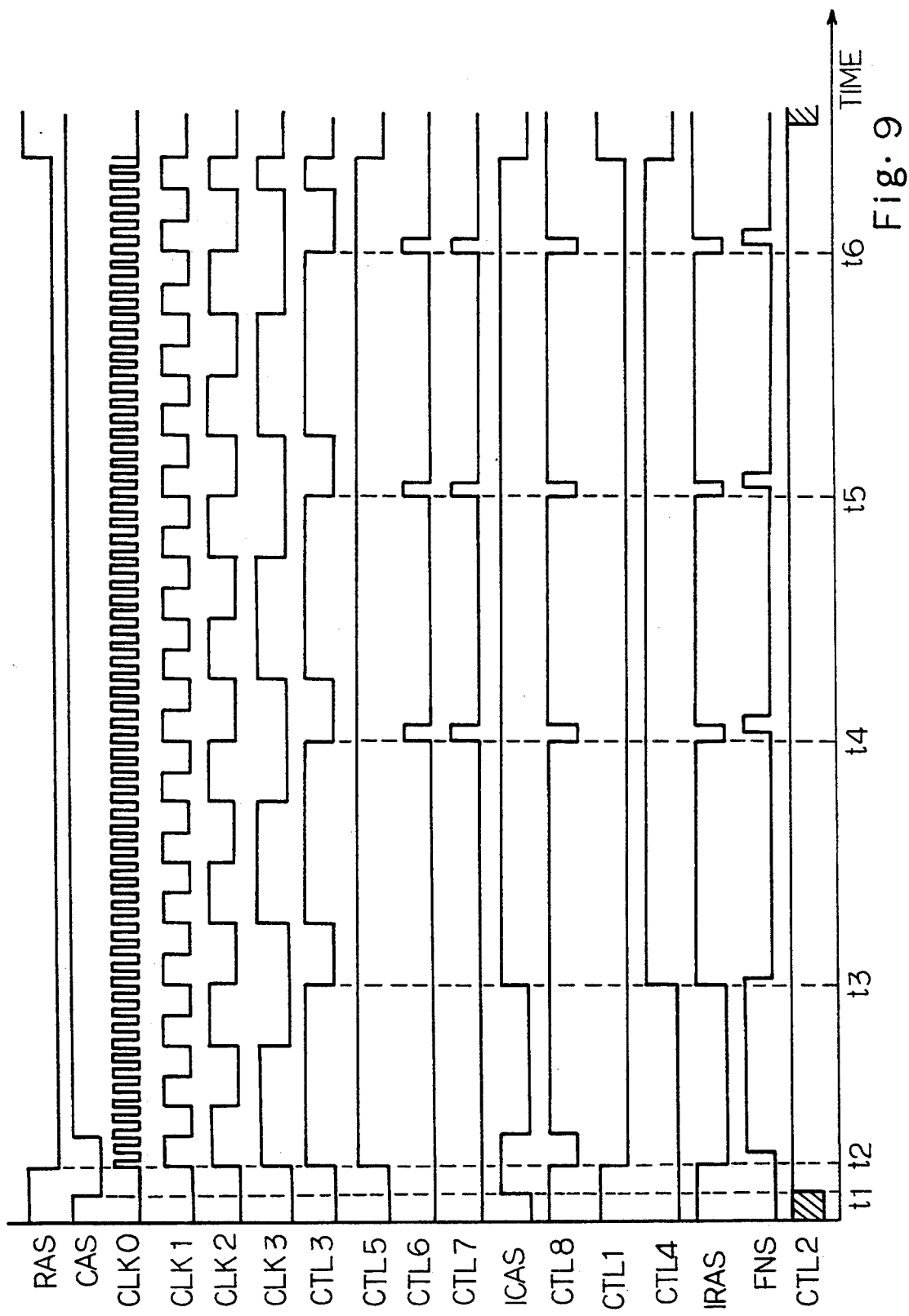
FIG. 9 is a diagram showing the waveforms of essential signals of the dynamic random access memory device shown in FIG. 1.

The fourth control signal CTL4 is supplied to the internal row address strobe generator 4a, and the circuit arrangement of the internal row address strobe generator 4a is illustrated in FIG. 6. The internal row address strobe generator 4a largely comprises an internal timing generator 4aa and an internal row address strobe controller 4ab for producing the internal row address strobe signal IRAS and a fifth control signal CTL5. The internal timing generator 4aa comprises four NOR gates NR7, NR8, NR9 and NR10, two inverting circuits IV10 and IV11 and two delay elements DL1 and DL2, and produces sixth and seventh control signals CTL6 and CTL7. The internal row address strobe controller 4ab comprises a series combination of two p-channel enhancement type field effect transistors Q1 and Q2 and two n-channel enhancement type field effect transistors Q3 and Q4 coupled between a power voltage line Vdd and a ground voltage line, a series combination of two p-channel enhancement type field effect transistors Q5 and Q6 and two n-channel enhancement type field effect transistors Q7 and Q8 coupled between the power voltage lines and the ground voltage line, a NOR gate NR11, and five inverting circuits IV12, IV13, IV14, IV15 and IV16. Before entry of the CAS-Before-RAS autorefreshing mode, both of the third and fourth control signals CTL3 and CTL4 remain in logic "0" level, and the internal timing generator 4aa causes the sixth and seventh control signals CTL6 and CTL7 to remain logic "0" level. The NOR gate NR11 is enabled with the seventh control signal CTL7, and is responsive to the complementary signal of the external row address strobe signal RAS. After entering the CAS-Before-RAS autorefreshing mode, the inverting circuit IV13 supplies the complementary signal of the external row address strobe signal RAS of logic "1" level, and the NOR gate NR11 causes the inverting circuit IV6 to shift the fifth control signal CTL5 in logic "1" level. However, if the external row address strobe signal RAS is recovered to logic "1" level, the fifth control signal CTL5 goes down to logic "0" level. The internal timing generator 4aa is further responsive to the finish signal FNS produced upon completion of the sense amplification, and complementarily shifts the sixth control signal CTL6 with respect to the finish signal FNS. The two series combinations Q1 to Q4 and Q5 to Q8 are responsive to the fourth and sixth control signals CTL4 and CTL6, and shifts the internal row address strobe signal IRAS to active logic "0" level at completion of every self-refreshing cycle in the autorefreshing mode. The internal row address strobe signal IRAS is supplied to the peripheral circuit group 3, and allows restarting the self-refreshing cycle on a row of the memory cell array 2 selected by the internal address counter 3e.

Figure 7:
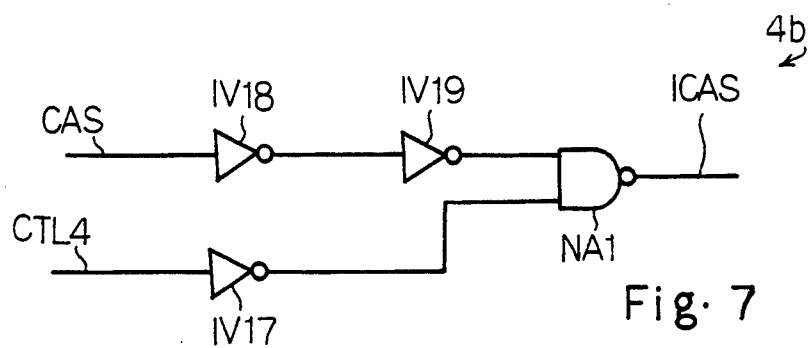
FIG. 7 is a circuit diagram showing the circuit arrangement of an internal column address strobe generator incorporated in the dynamic random access memory device shown in FIG. 1.

The external column address strobe signal CAS is supplied to the internal column address strobe generator 4b as described hereinbefore, and the circuit arrangement of the internal column address strobe generator 4b is illustrated in FIG. 7. The internal column address strobe generator 4b comprises three inverting circuits IV17, IV18 and IV19 and a NAND gate NA1, and produces an internal column address strobe signal ICAS. The NAND gate NA1 shifts the internal column address strobe signal ICAS to logic "0" level upon recovery of the external column address strobe signal CAS to logic "1" level, and allows the internal column address strobe signal ICAS to go up upon decay of the fourth control signal CTL4. Thus, the internal column address strobe generator 4b keeps the internal column address strobe signal ICAS in active logic "0" level after the recovery of the external column address strobe signal CAS, and, accordingly, allows the autorefreshing unit 4 to remain the autorefreshing mode. By virtue of the internal column address strobe signal ICAS, the external source of the column address strobe signal CAS can decrease current consumption. The internal column address strobe signal ICAS is supplied to the CBR counter controller 4c, and the CBR counter controller 4c produces an eighth control signal CTL8. The eighth control signal CTL8 is supplied to the peripheral circuit group 3.

Figure 8:
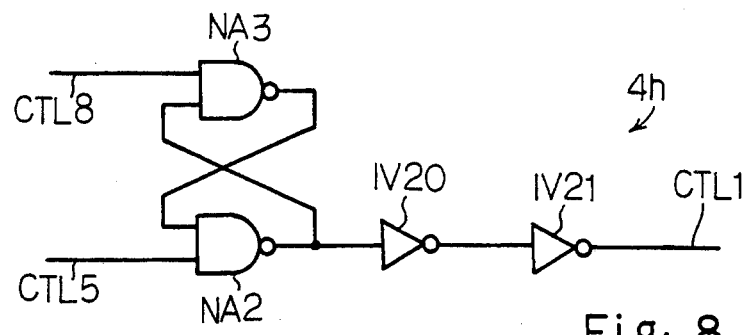
FIG. 8 is a circuit diagram showing the circuit arrangement of a timer controller 4h incorporated in the dynamic random access memory device shown in FIG. 1.

The eighth control signal CTL8 is supplied to the timer controller 4h, and the timer controller 4h is responsive to the fifth and eighth control signals CTL5 and CTL8. The circuit arrangement of the timer controller 4h is illustrated in FIG. 8. The timer controller 4h comprises two NANd gates NA2 and NA3 and two inverting circuits IV20 and IV21, and the NAND gates NA2 and NA3 form in combination a flip flop circuit. The flip flop circuit implemented by the NAND gates NA2 and NA3 is supplied with the fifth and eighth control signals CTL5 and CTL8, and the inverting circuit IV21 produces the first control signal CTL1. Before entry of the CAS-Before-RAS autorefreshing mode, the fifth and eighth control signals CTL5 and CTL8 are logic "0" level and logic "1" level, respectively, and the inverting circuit IV21 maintains the first control signal CTL1 in logic "1" level. However, when the external row address strobe signal RAS goes down after decay of the external column address strobe signal CAS, the fifth and eighth control signals CTL5 and CTL8 are respectively shifted to logic "1" level and logic "0" level, and the flip flop circuit implemented by the NAND gates NA2 and NA3 shifts the output node thereof to logic "0" level. This results in the first control signal CTL1 of active logic "0" level, and the timer controller 4h keeps the first control signal CTL1 in logic "0" level until recovery of the external row address strobe signal RAS to logic "1" level.

The dynamic random access memory device thus arranged behaves as follows. Assuming now that the external column address strobe signal CAS goes down to logic "0" level at time t1, the dynamic random access memory device enters the CAS-Before-RAS autorefreshing mode of operation upon decay of the external row address strobe signal RAS at time t2. The internal column address strobe generator 4b latches the external column address strobe signal CAS at time t1, and shifts the internal column address strobe signal ICAS to logic "1" level. The internal row address strobe generator 4a shifts the fifth control signal CTL5 to logic "1" level, and the CBR counter controller 4c shifts the eighth control signal CTL8 to logic "0" level at time t2. Then, the timer controller 4h admits the memory device into the autorefreshing mode, and shifts the first control signal CTL1 to logic "0" level. With the first control signal CTL1 of logic "0" level, the pulse generator 4e produces the basic clock signal CLK0, and the divider 4f is allowed to produce the first to third clock signals CLK1 to CLK3. Since the second control signal CTL2 is in logic "1" level, the timer 4g selects the first clock signal CLK1, and the timer 4g periodically shifts the third control signal CTL3 between logic "1" level and logic "0" level.

If the external row address strobe signal RAS continues to be in logic "0" level for a predetermined time period, the third control signal CTL3 is decayed to logic "0" level at time t3, and the self-refresh controller 4d recovers the fourth control signal CTL4 to logic "1" level. With the fourth control signal CTL4 of logic "1" level, the internal row address strobe generator 4a lifts the internal row address strobe signal IRAS to logic "1" level, and the precharging circuit 3a enters a precharging period for the bit line pairs BL1 to BLn. While the external row address strobe signal RAS is maintained in logic "0" level, the timer 4g continues to periodically produce the third control signal CTL3 at times t4, t5 and t6, and the internal row address strobe generator 4a swings the internal row address strobe signal IRAS in synchronism with the third control signal CTL3. Then, the self-refreshing cycle is repeated for the rows of the memory cell array 2. Every self-refreshing cycle is completed within tens nanoseconds, and the finish signal FNS is produced upon every completion.

Figure 10:
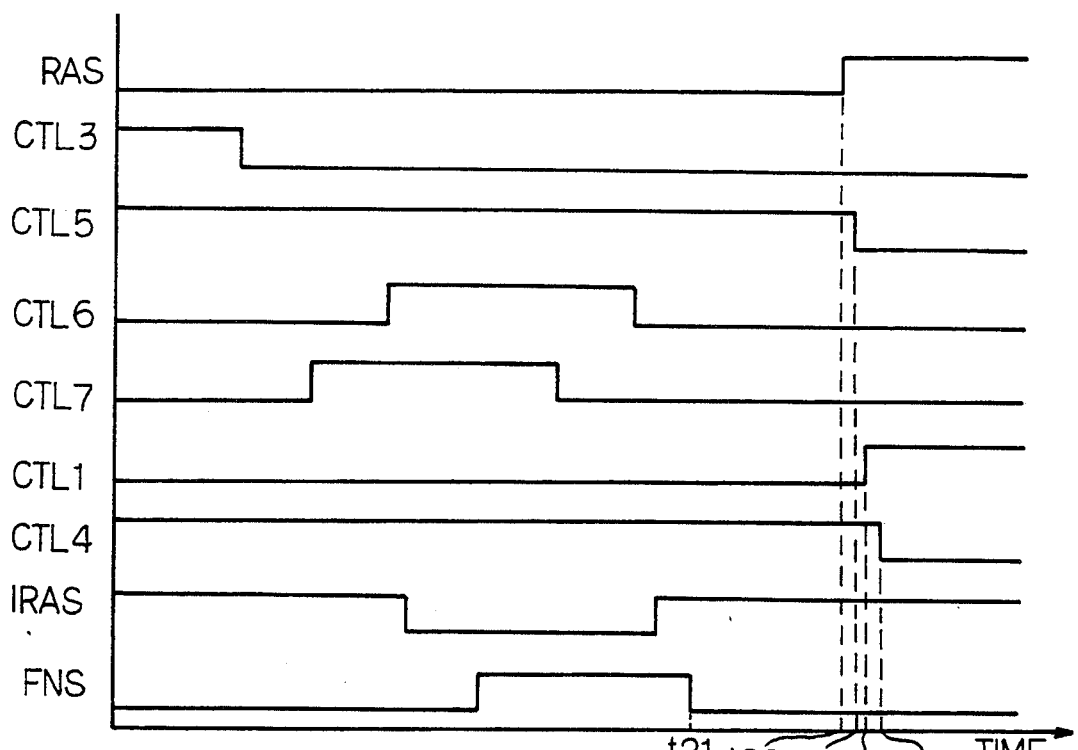
FIG. 10 is a diagram showing the waveforms of the essential signals for interrupting the self-refreshing cycle while the internal row address strobe signal is in inactive logic "1" level.
Figure 11:
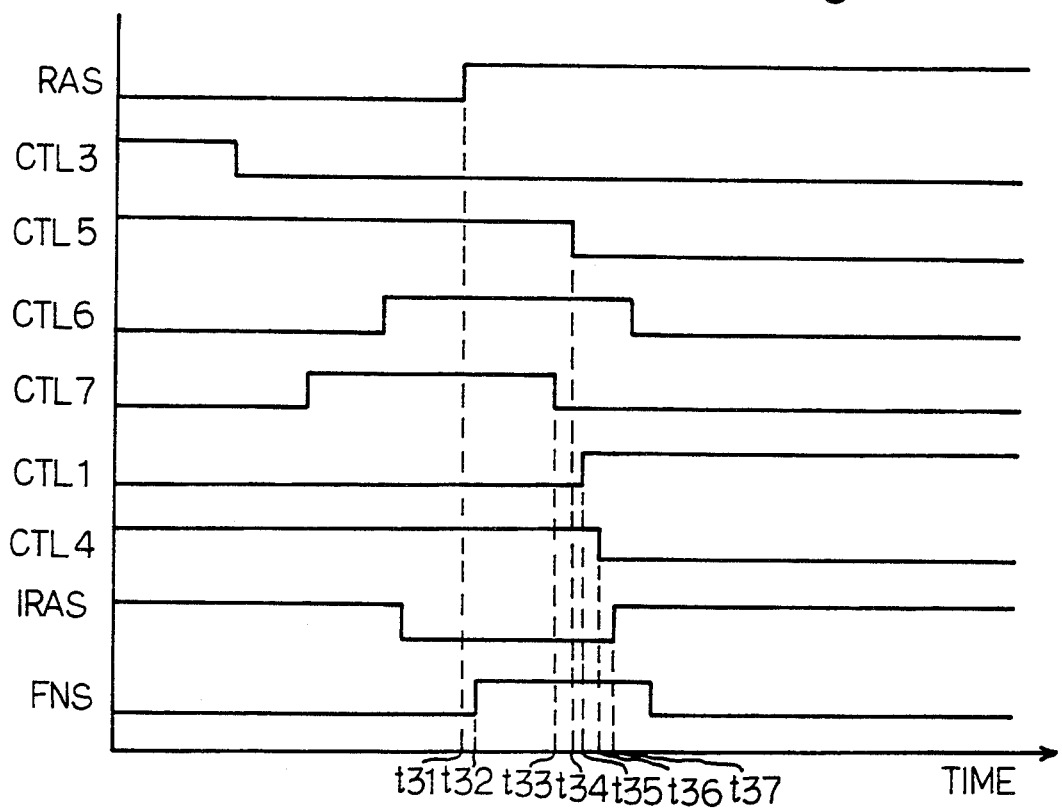
FIG. 11 is a diagram showing the waveforms of the essential signals for interrupting the self-refreshing cycle while the internal row address strobe signal is in active logic "0" level.

A write-in request or a read-out request interrupts the self-refreshing cycle, and description is made on the interruption with reference to FIGS. 10 and 11. Assuming now that the internal row address strobe signal IRAS is kept in inactive logic "1" level after the finish signal FNS at time t21 as shown in FIG. 10, the external row address strobe signal RAS is recovered to logic "1" level at time t22, and the fifth control signal CTL5 goes down to logic "0" level at time t23, because the seventh control signal CTL7 has been already shifted to logic "0" level. The fifth control signal CTL5 of logic "0" level causes the timer controller 4h to shift the first control signal CTL1 to inactive logic "1" level at time t24, and the pulse generator 4e and the divider 4f terminate their operations. The timer 4g also terminates the production of the third control signal CTL3, and, accordingly, the self-refresh controller 4d fixes the fourth control signal CTL4 to logic "0" level at time t25.

On the other hand, if the external row address strobe signal RAS is recovered to inactive logic "1" level at time t31, the internal row address strobe signal IRAS is in active logic "0" level as shown in FIG. 11, and the seventh control signal CTL7 goes down to logic "0" level at time t33 after the finish signal FNS of logic "1" takes place at time t32. With the seventh control signal CTL7 of logic "0" level, the internal row address strobe generator 4a shifts the fifth control signal CTL5 to logic "0" level at time t34, and the timer controller 4h recovers the first control signal CTL1 to inactive logic "1" level. Then, the pulse generator 4e and the divider 4f are inactivated, and the third control signal CTL3 never goes up to logic "1" level. For this reason, the fourth control signal CTL4 is recovered to inactive logic "0" level at time t36, and the internal row address strobe signal IRAS is lifted to inactive logic "1" level at time t37.

Figure 12:
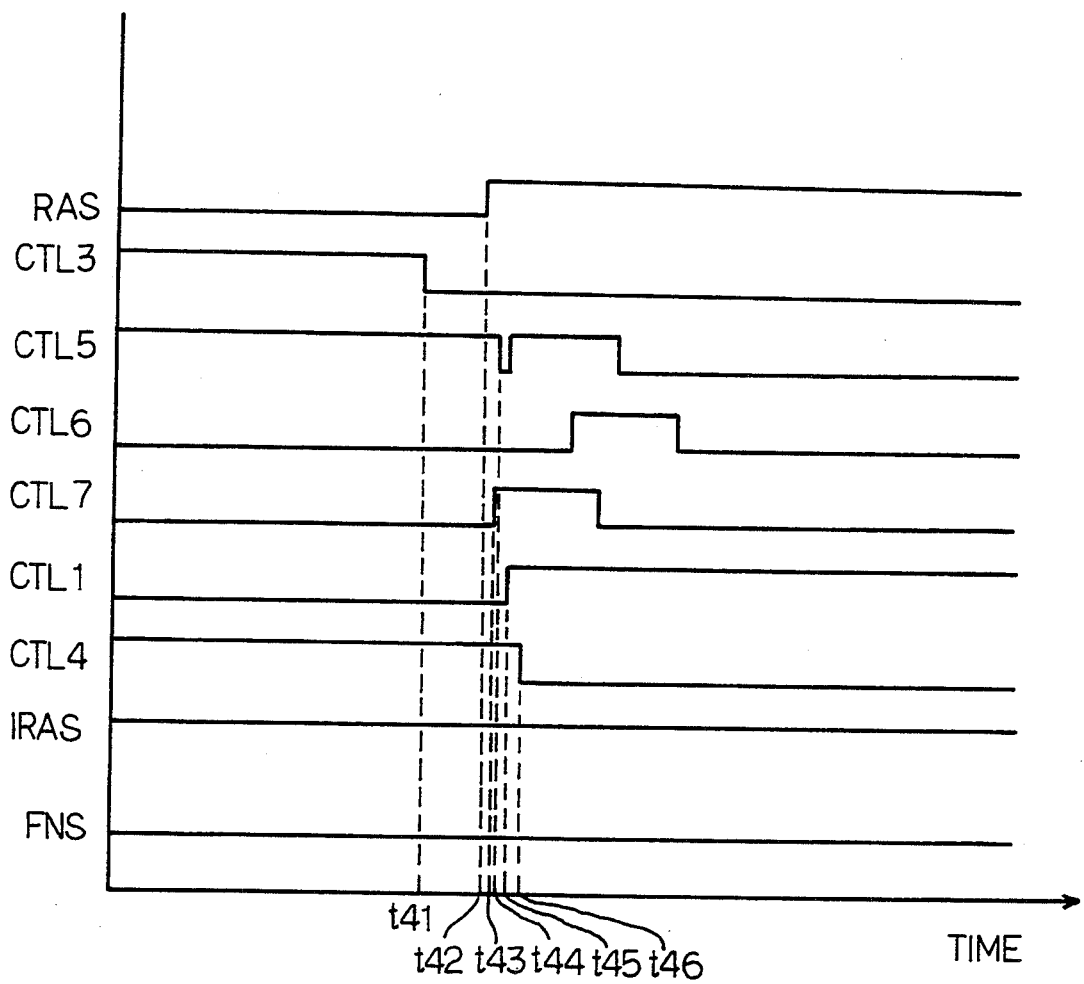
FIG. 12 is a diagram showing the waveforms of the essential signals for yet another interruption of the self-refreshing cycle.

FIG. 12 shows another interruption of the self-refreshing cycle carried out by the dynamic random access memory device shown in FIG. 1. Since the third control signal CTL3 is periodically decayed to logic "0" level as at time t41, the external row address strobe signal RAS may be recovered to inactive logic "1" level as at time t42 before the seventh control signal CTL7 goes up to logic "1" level at time t43 in the presence of the third control signal CTL3 of logic "0" level. The fifth control signal CTL5 momentarily goes down to logic "0" level from time t44. However, the first control signal CTL1 is lifted to inactive logic "1" level at time t45, and the fourth control signal CTL4 is recovered to logic "0" level at time t46. The delay element DL1 introduces time delay into propagation of the seventh control signal CTL7, and the internal row address strobe signal IRAS remains inactive.

Second Embodiment

Figure 13:
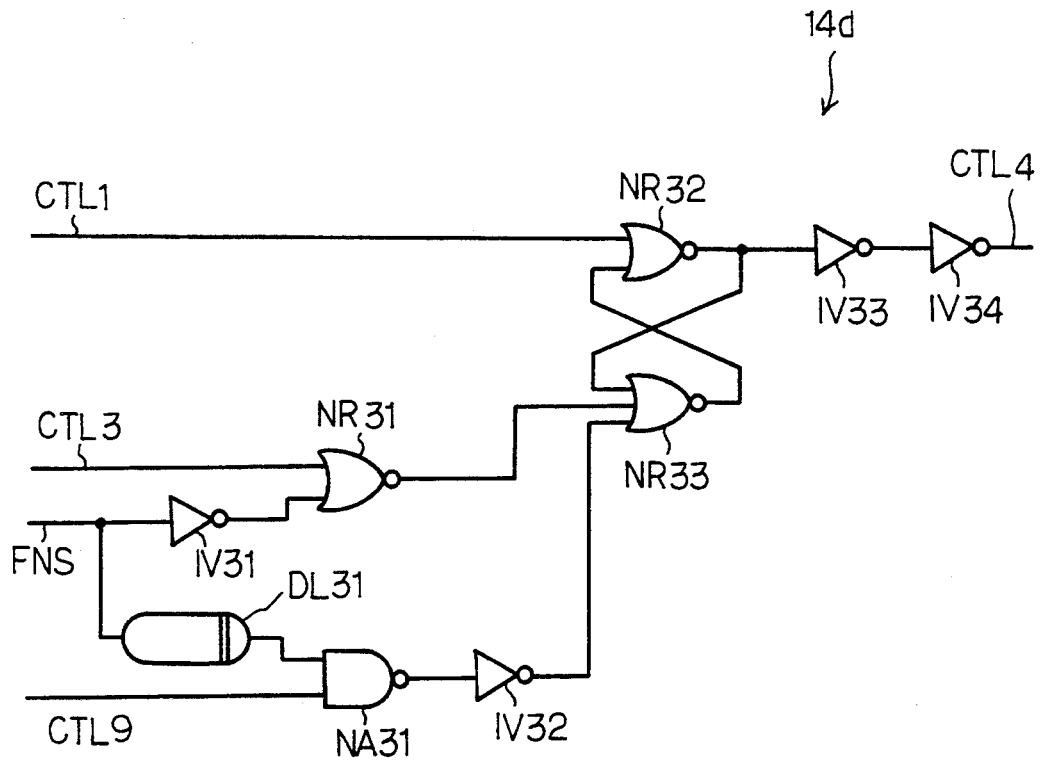
FIG. 13 is a circuit diagram showing the circuit arrangement of a self-refresh controller incorporated in another dynamic random access memory device according to the present invention.
Figure 14:
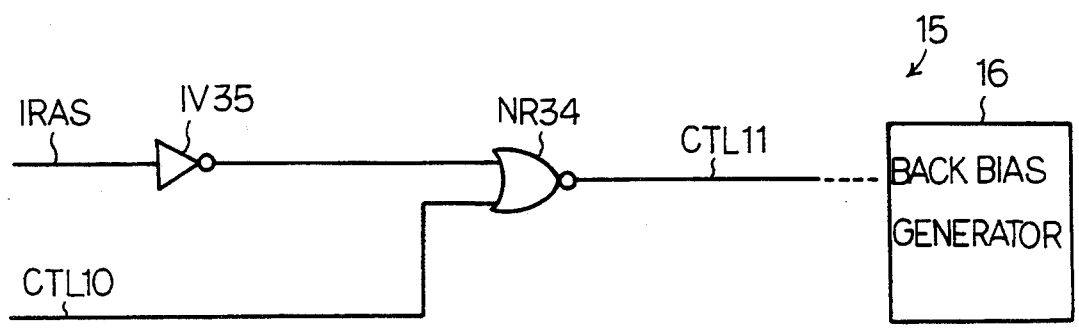
FIG. 14 is a circuit diagram showing the circuit arrangement of a back-bias generator incorporated in the dynamic random access memory device.

Turning to FIG. 13 of the drawings, a self-refresh controller 14d incorporated in another dynamic random access memory device embodying the present invention comprises three NOR gates NR31, NR32 and NR33, three inverting circuits IV31, IV32, IV33 and IV34, a NAND gate NA31 and a delay element DL31. The self-refresh controller 4d of the first embodiment is replaced with the self-refresh controller 14d, and a back-bias controller 15 shown in FIG. 14 is newly added thereto. The back-bias controller 15 comprises an inverting circuit IV35 and a NOR gate NR34. However, the other component units and circuits are similar to those of the first embodiment, and no further description is incorporated hereinbelow. Signals labeled with the same references are corresponding to those of the first embodiment. When a CAS-Before-RAS control is executed in the presence of a write enable signal WE of active logic "0" level, the dynamic random access memory device enters a write CBR autorefreshing mode, and a ninth control signal CTL9 goes down to logic "0" level. A tenth control signal CTL10 is lifted to logic "1" level if a back-bias voltage exceeds a predetermined level, and the back bias controller 15 is activated. Upon activation of the back bias controller 15, an eleventh control signal CTL11 allows a back bias generator 16 to supply a back bias to the semiconductor substrate. The back bias generator 16 is incorporated in the peripheral circuit group 3.

Figure 15:
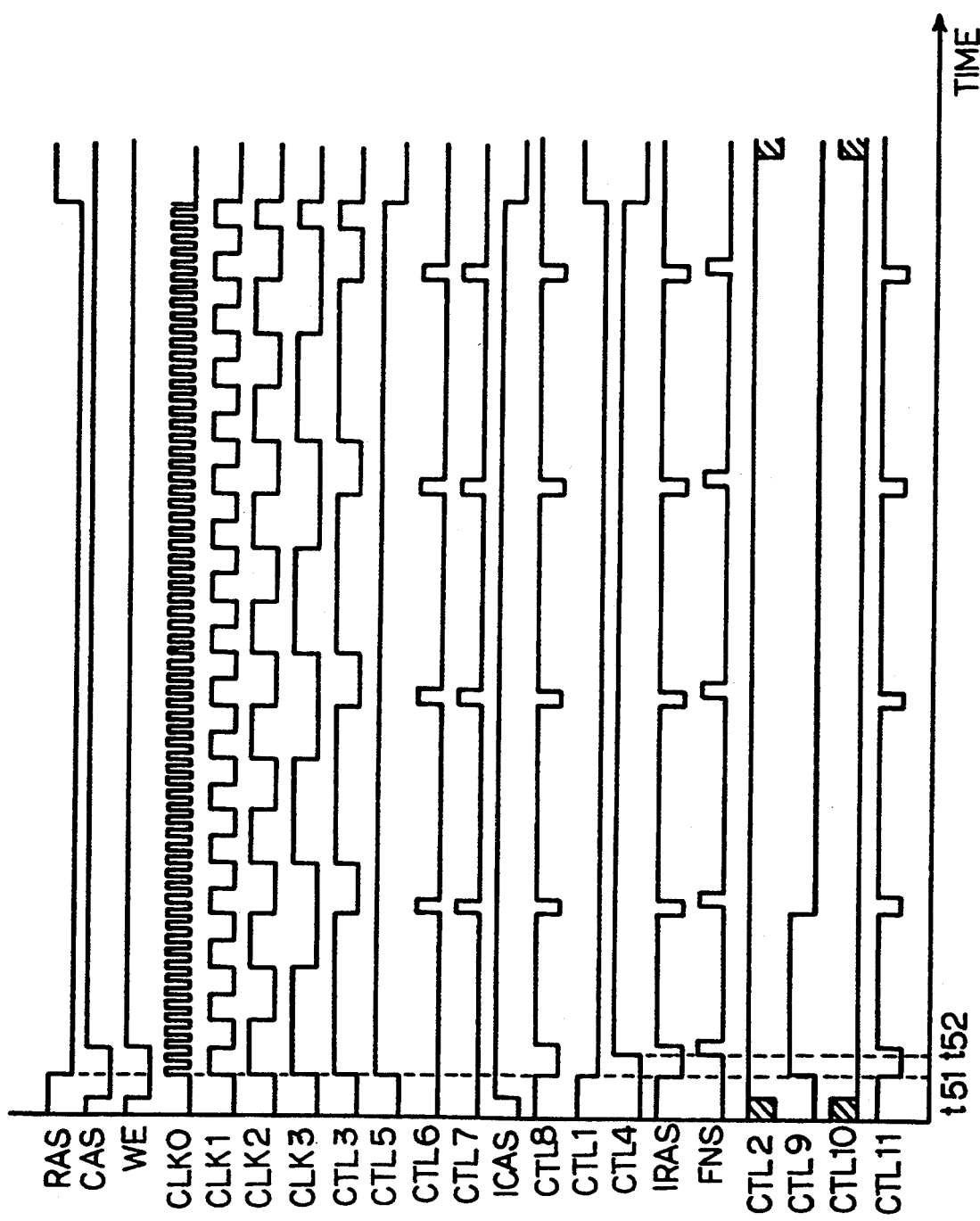
FIG. 15 is a diagram showing the waveforms of essential signals for the dynamic random access memory device.

FIG. 15 illustrates the write CBR autorefreshing mode of operation. If the external row address strobe signal RAS, the external column address strobe signal CAS and the write enable signal WE establishes the write CBR autorefreshing mode, a self-refreshing cycle is carried out on a row of the memory cell array 2. Namely, the ninth control signal CTL9 is immediately shifted to logic "1" level at time t51, and the fourth control signal CTL4 goes up to logic "1" level upon elevation of the finish signal FNS at time t52. After the elevation of the fourth control signal CTL4, the control sequence is similar to that of the first embodiment, and no further description is incorporated hereinbelow.

The autorefreshing unit 4 of the first embodiment starts the self-refreshing cycle upon predetermined lapse of time after decay of the external row address strobe signal RAS. However, the autorefreshing unit of the second embodiment immediately enters a self-refreshing cycle upon elevation of the finish signal FNS after the write CBR control, and the internal row address strobe signal IRAS goes up to logic "1" level. This results in inactivation of some peripheral circuits.

The dynamic random access memory device implementing the second embodiment is equipped with the back bias controller 15, and the back bias controller 15 improves average current consumption. Namely, the tenth control signal CTL10 enables the NOR gate NR34 to produce the eleventh control signal CTL11 in synchronism of the internal row address strobe signal IRAS, however, the eleventh control signal CTL11 keeps the back bias generator 16 inactive while the tenth control signal CTL10 is in logic "1" level. Therefore, the back bias generator 16 is intermittently activated depending upon the actual back bias voltage, and the average current consumption is decreased.

As will be appreciated from the foregoing description, the dynamic random access memory device can automatically refresh data bits stored in the memory cells without any external signal control, and the autorefreshing unit makes a program sequence for the external device simple.

Although particular embodiments of the present invention have been shown and described, it will be obvious to those skilled in the art that various changes and modifications may be made without departing from the spirit and scope of the present invention.

What is claimed is:

1. A dynamic random access memory device having a standard mode and an autorefreshing mode of operation, comprising:

a) a plurality of memory cells arranged in rows and columns;

b) peripheral circuits operative to assist a read-out cycle and a write-in cycle in said standard mode and to be responsive to an internal row address strobe signal for carrying out a self-refreshing cycle in said autorefreshing mode of operation; and c) an autorefreshing unit responsive to an external column address strobe signal as well as an external row address strobe signal sequentially shifted to an active level in a predetermined order, and operative to periodically produce said internal row address strobe signal for causing said peripheral circuits to repeat said self-refreshing cycle and to produce an internal column address strobe signal on the basis of said external column address strobe signal so as to continue to remain in said autorefreshing mode even if said external column address strobe signal is recovered to an inactive level before producing said integral row address strobe signal, said autorefreshing unit comprising:

c-1) a timer controller operative to produce a first control signal upon entry of said autorefreshing mode, c-2) a pulse generator responsive to said first control signal, and producing a basic clock signal, c-3) a divider activated with said first control signal, and producing first, second and third clock signals different in pulse width from one another on the basis of said basic clock signal, c-4) a timer responsive to a second control signal for selecting either the first or third clock signal, and producing a third control signal, c-5) a self-refresh controller supplied with said first and third control signal as well as with a finish signal indicative of completion of a sense amplification carried out in said peripheral circuits, and producing a fourth control signal, c-6) an internal row address strobe generator supplied with said external row address strobe signal and said fourth control signal, and producing said internal row address strobe signal and a fifth control signal, c-7) an internal column address strobe generator supplied with said external column address strobe signal and said fourth control signal, and producing said internal column strobe signal, and c-8) a CBR counter controller supplied with said internal column address strobe signal, and producing an eighth control signal, said eighth control signal being supplied to said peripheral circuits, said timer controller discriminating said autorefreshing mode in the co-presence of said fifth and eighth control signals.

2. A dynamic random access memory device having a standard mode and an autorefreshing mode of operation, comprising:

a) a plurality of memory cells arranged in rows and columns;

b) peripheral circuits operative to assist a read-out cycle and a write-in cycle in said standard mode and to be responsive to an internal row address strobe signal for carrying out a self-refreshing cycle in said autorefreshing mode of operation; and c) an autorefreshing unit responsive to an external column address strobe signal as well as an external row address strobe signal sequentially shifted to an active level in a predetermined order, and operative to periodically produce said internal row address strobe signal for causing said peripheral circuits to repeat said self-refreshing cycle and to produce said internal column address strobe signal on the basis of said external column address strobe signal so as to continue to remain in said autorefreshing mode even if said external column address strobe signal is recovered to an inactive level before producing said internal row address strobe signal, said autorefreshing unit comprising:

c-1) a timer controller operative to produce a first control signal upon entry of said autorefreshing mode, c-2) a pulse generator responsive to said first control signal, and producing a basic clock signal, c-3) a divider activated with said first control signal, and producing first, second and third clock signals different in pulse width from one another on the basis of said basic clock signal, c-4) a timer responsive to a second control signal for selecting either the first or third clock signal, and producing a third control signal, c-5) a self-refresh controller supplied with said first and third control signals, a finish signal indicative of completion of a sense amplification carried out in said peripheral circuits, and a ninth control signal indicative of a shift of an external write enable signal before said external column and row address strobe signals, and producing a fourth control signal, c-6) an internal row address strobe generator supplied with said external row address strobe signal and said fourth control signal, and producing said internal row address strobe signal and a fifth control signal, c-7) an internal column address strobe generator supplied with said external column address strobe signal and said fourth control signal, and producing said internal column strobe signal, and c-8) a CBR counter controller supplied with said internal column address strobe signal, and producing an eighth control signal, and said eighth control signal being supplied to said peripheral circuits, said timer controller discriminating said autorefreshing mode in the co-presence of said fifth and eighth control signals.

3. A dynamic random access memory device as set forth in claim 2, in which characteristics of said plurality of memory cells are taken into account by using said second control signal to select one of the first and third clock signals.

4. A dynamic random access memory device as set forth in claim 2, in which said dynamic random access memory device further comprises a back bias generator for controlling a back bias voltage level of a semiconductor substrate, and a back bias controller responsive to a tenth control signal indicative of said back bias voltage level higher than a target level and producing an eleventh control signal in synchronism with said internal row address strobe signal for actuating said back bias generator.

* * * * *

UNITED STATES PATENT AND TRADEMARK OFFICE
CERTIFICATE OF CORRECTION

PATENT NO. : 5,347,491
DATED : September 13, 1994
INVENTOR(S) : Akihiko Kagami

It is certified that error appears in the above-indentified patent and that said Letters Patent is hereby corrected as shown below:

Col. 9, line 60, delete "integral", insert --internal--.

Signed and Sealed this

Thirty-first Day of January, 1995

Attest:

BRUCE LEHMAN

*Attesting Officer*     *Commissioner of Patents and Trademarks*